United States Patent
Takenaka

(10) Patent No.: US 7,123,249 B2
(45) Date of Patent: Oct. 17, 2006

(54) DISPLAY DEVICE INCLUDING IMPERFECT CONNECTION PARTS EXTENDING BETWEEN PRINTED CIRCUIT BOARDS FOR BRIDGING

(75) Inventor: Yuuichi Takenaka, Mobara (JP)

(73) Assignees: Hitachi Displays, Ltd., Chiba-ken (JP); Hitachi Device Engineering Co., Ltd., Chiba-ken (JP)

( * ) Notice: Subject to any disclaimer, the term of this patent is extended or adjusted under 35 U.S.C. 154(b) by 376 days.

(21) Appl. No.: 10/624,601

(22) Filed: Jul. 23, 2003

(65) Prior Publication Data

US 2004/0017536 A1   Jan. 29, 2004

(30) Foreign Application Priority Data

Jul. 26, 2002 (JP) .............................. 2002-218042

(51) Int. Cl.
*G09G 3/30* (2006.01)
*H05K 7/20* (2006.01)

(52) U.S. Cl. .................... 345/206; 345/78; 361/721

(58) Field of Classification Search ................ 349/150, 349/151; 345/206; 428/209, 194
See application file for complete search history.

(56) References Cited

U.S. PATENT DOCUMENTS

| | | | | |
|---|---|---|---|---|
| 6,021,050 A | * | 2/2000 | Ehman et al. | 361/793 |
| 6,738,123 B1 | * | 5/2004 | Takahashi et al. | 349/152 |
| 6,869,664 B1 | * | 3/2005 | Vasoya et al. | 428/209 |
| 6,954,985 B1 | * | 10/2005 | Lee et al. | 29/852 |

* cited by examiner

*Primary Examiner*—Amare Mengistu
*Assistant Examiner*—Donna Lui
(74) *Attorney, Agent, or Firm*—Reed Smith LLP; Stanley P. Fisher, Esq.; Juan Carlos A. Marquez, Esq.

(57) ABSTRACT

In a display device including a display panel and a multi-layered printed circuit board which is arranged along one side of the display panel and is electrically connected to a plurality of leads of the display panel through a plurality of tape carrier packages, according to the present invention, a plurality of slits or notches are formed in a sheet fiber member which is impregnated with resin and constitutes a base sheet of the multi-layered printed circuit board along one side of the display panel. The discontinuity of the sheet fiber member formed by the slits or the notches absorbs the difference in thermal expansion of the multi-layered printed circuit board and the display panel due to the change of an ambient temperature of the display device and hence, it is possible to prevent peeling of the tape carrier package from the display panel or breaking of the tape carrier package per se.

10 Claims, 8 Drawing Sheets

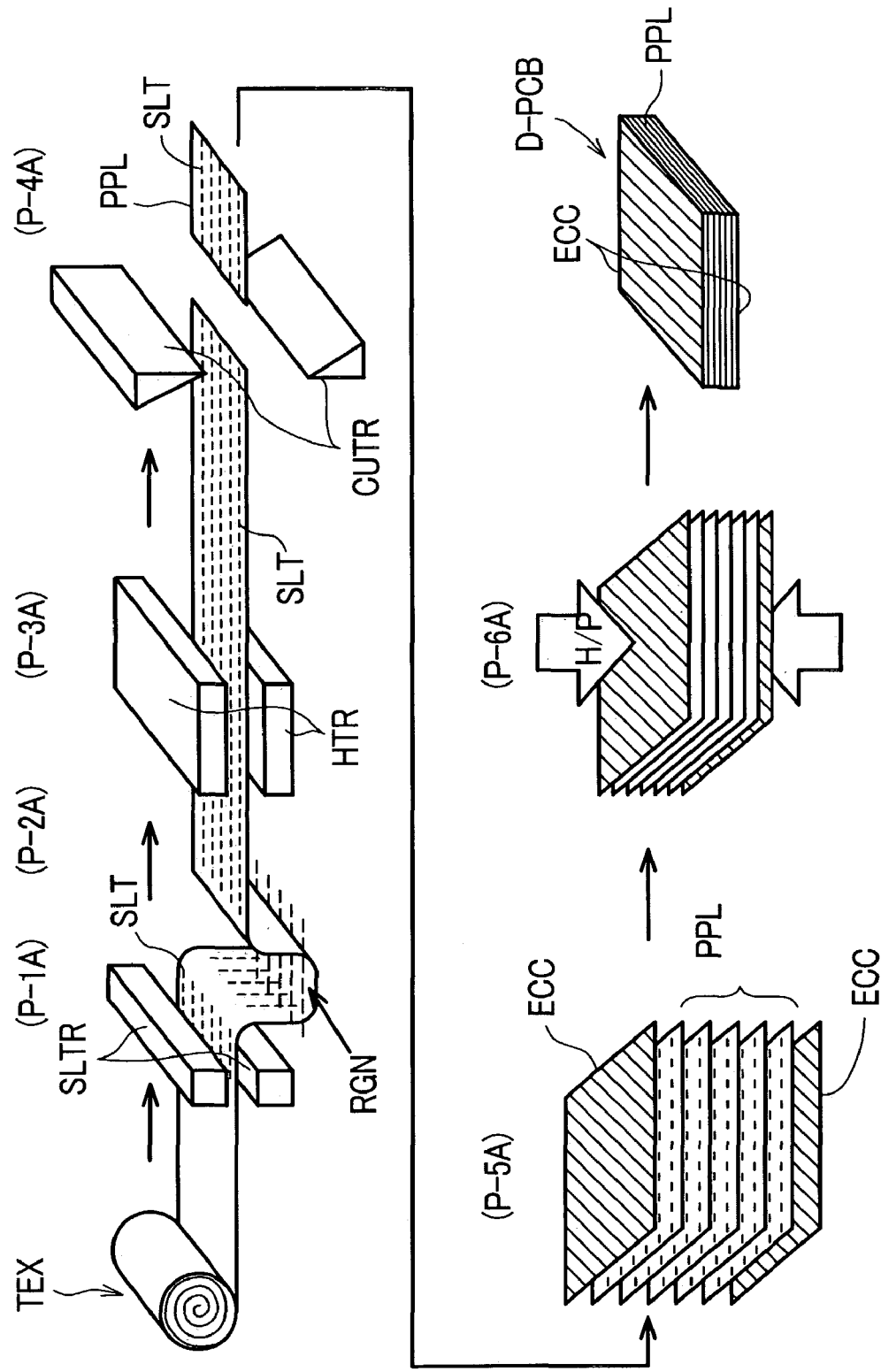

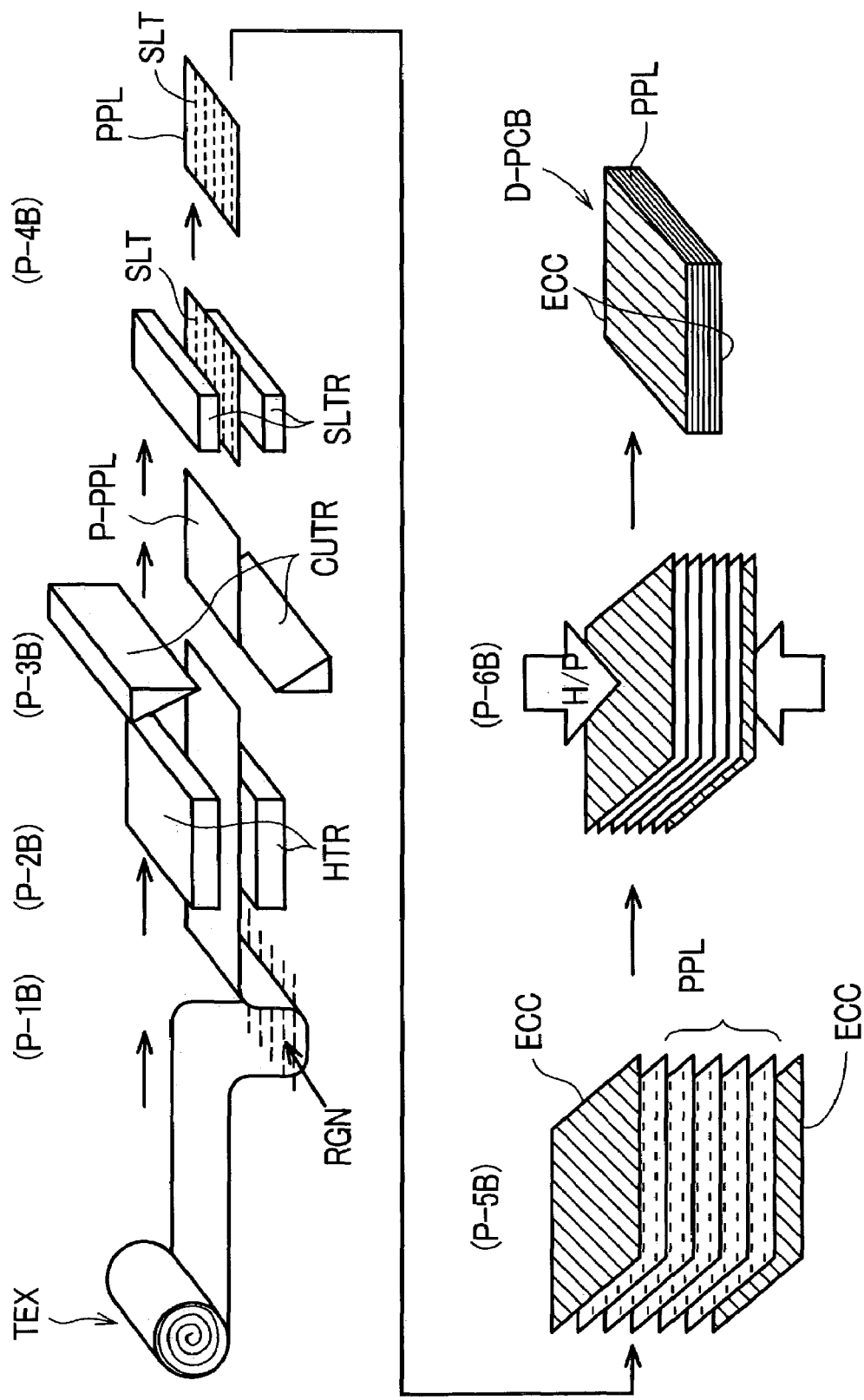

DISPLAY DEVICE INCLUDING IMPERFECT CONNECTION PARTS EXTENDING BETWEEN PRINTED CIRCUIT BOARDS FOR BRIDGING

BACKGROUND OF THE INVENTION

1. Field of the Invention

The present invention relates to a display device, and more particularly to a display device which can obviate drawbacks such as disconnection of a connection portion or a printed circuit board for bridging caused by elongation and shrinkage of a multi-layered printed circuit board which supplies signals for display transmitted from a signal source side to leads for supplying signals for display to a large number of respective electrodes formed on an inner surface of an insulating substrate.

2. Description of the Related Art

Recently, as display means of information equipment such as a personal computer or a television set, a so-called flat-panel-type display device has been popularly used. As this type of flat-panel-type display device, a display device using a liquid crystal panel, a plasma panel and an organic EL panel have been widely known. Although these display devices are classified into several types depending on pixel selection methods, the active matrix method which performs the selection of pixels using active elements such as thin film transistors constitutes the main stream.

The flat-panel-type display device includes an insulating substrate on which active elements are formed and pixel forming elements are provided between pixel electrodes which are driven by the selected active elements and another electrodes. The insulating substrate is usually formed of a glass plate or a ceramic plate. As the flat-panel-type display device, a display device which uses a liquid crystal panel which changes orientations of molecules of liquid crystal present between the above-mentioned pixel electrodes and another electrodes constitutes a typical example. Further, in the display device which uses a plasma panel, a plasma discharge is generated between pixel electrodes driven by selected active elements and another electrodes and ultraviolet rays generated by the plasma discharge are subjected to the wavelength conversion by fluorescent materials formed on another substrate.

Then, the display device which uses the organic EL panel sandwiches light emitting layers made of an organic material between pixel electrodes and other electrodes and generates visible images by making use of a so-called electric field light-emitting phenomenon. Respective flat-panel-type display devices of these types adopt substantially the same mechanism for selection of pixels and hence, the explanation is made by taking the active-matrix type liquid crystal display device using thin film transistors as active elements as an example. That is, the present invention is not limited to such a liquid crystal display device and is applicable to the above-mentioned other flat-panel-type display devices.

The active-matrix type liquid crystal display device (hereinafter, simply referred to as "liquid crystal display device") includes a plurality of groups of first electrodes (hereinafter also referred to as "scanning lines", "gate lines" or "pixel selection lines") which are formed in the direction which bridges one parallel side of an insulating substrate which generally forms a rectangular screen. Further, the liquid crystal display device also includes another insulating substrate which mounts a group of second electrodes (hereinafter also referred to as "data lines", "source lines" or "drain lines", "video signal lines") thereon, wherein the group of second electrodes are formed in the direction which bridges another parallel side of the insulating substrate such that they cross the gate lines. Then, liquid crystal made of liquid crystal composition is sandwiched between the above insulating substrate and another insulating substrate thus constituting a liquid crystal panel.

The gate lines and the source lines are pulled out to end peripheries of the insulating substrate or are connected to leads provided to the end peripheries of the insulating substrate. Along the end periphery of the insulating substrate, a multi-layered printed circuit board is arranged and an electric connection between the leads and wiring formed on the multi-layered printed circuit board is established by printed circuit boards which connect the leads as a plurality of groups of leads or printed circuit boards for bridging which are referred to as tape carrier packages (TCP) or a chip-on-films (COF). Here, the tape-carrier-package TCP and the chip-on-film COF are printed circuit boards on which the semiconductor chips are mounted. Further, there exists another printed circuit board which directly mounts the semiconductor chips IC on end periphery of the insulating substrate. In this case, the connection between the insulating substrate and the wiring of the multi-layered printed circuit board is performed using a printed circuit board wiring simply. Such a connection is performed using solder or anisotropic conductive films ACF. Hereinafter, the explanation is made by mainly taking a case in which the above-mentioned connection is established using the tape carrier package TCP as an example.

Here, the modes of connection between the terminals of the gate lines and the source lines with the multi-layered printed circuit board are substantially equal and hence, the explanation is made only with respect to the mode for supplying signals at the source line side which constitutes the high density wiring hereinafter. The multi-layered printed circuit board includes laminated wiring consisting of a plurality of layers (for example, 6 to 10 layers) and transmits display data and timing signals such as a line clock signal (line pulse or referred to as CL1 in general), a pixel clock signal (a pixel pulse or a dot clock, CL2 in general), a frame clock signal (a frame pulse, referred to as CL3 in general) which are inputted from an external signal source (a host computer, a video signal generating circuit or the like) and supplies these signals to lead terminals of the source lines via the above-mentioned carrier tape packages TCP which mount leads of source lines as a group of plurality of lines on an insulating substrate. As literatures which disclose the constitution of the liquid crystal display device, JP-A-60-70601 and JP-B-51-13666 are named.

SUMMARY OF THE INVENTION

Recently, along with the progress of flattening of a television receiver set or the like, a display device becomes large-sized. Accordingly, a longitudinal size of the above-mentioned multi-layered printed circuit board which is arranged along an end periphery (a side) of an insulating substrate is increased. As mentioned previously, a distance between the multi-layered printed circuit board and an insulating substrate is densely bridged with the tape carrier packages TCP. Accordingly, depending on a using environment of the display device, due to the difference in the thermal expansion coefficient between the insulating substrate and the multi-layered printed circuit board or due to the thermal deformation attributed to the difference in the thermal expansion coefficient or a residual stress after thermal deformation, the insulating substrate is warped or the tape carrier package TCP or the chip-on-film COF is disconnected or broken thus giving rise to a possibility that a defective display is induced.

As means to obviate the phenomenon that the warp occurs on the insulating substrate and the tape carrier package TCP or the chip-on-film COF is broken thereby bringing about the connection failure between the leads and the wiring of the tape carrier package TCP, conventionally, there have been known (A) means which arranges the multi-layered printed circuit board divided into a plurality of sections along the longitudinal direction of the insulating substrate (JP-A-11-73127) and (B) means which uses a flexible printed circuit board (FPC) as the multi-layered printed circuit board and slits are formed in the flexible printed circuit board FPC (JP-A-6-18914).

However, according to the above-mentioned means (A), it is necessary to align the insulating substrate with a plurality of multi-layered printed circuit boards and this impedes the enhancement of the production efficiency. Further, it is necessary to provide terminals for electric connection among a plurality of divided printed circuit boards and, at the same time, the total area of the multi-layered printed circuit board per se must be increased by an area which is allocated to the terminals. Accordingly, it becomes difficult to decrease an area around a display area of the display device (a so-called picture frame area). On the other hand, according to the means (B), it is difficult to manufacture the elongated flexible printed circuit board FPC with high accuracy and, at the same time, the elongated flexible printed circuit board FPC is easily elongated and shrunken due to the influence of the using environment whereby the degree of freedom in designing on the electric connection between the tape carrier packages TCP or the like with the connection terminals is small. Further, when this slit structure is applied to the multi-layered printed circuit board, it is necessary to lay out the wiring inside the printed circuit board to avoid the slits and hence, it becomes necessary to enlarge the area. Accordingly, the application of the means (B) to the multi-layered printed circuit board is technically difficult and, at the same time, in the same manner as the means (A), the picture frame area reduction effect for display device cannot be obtained.

Accordingly, it is an object of the present invention to provide a display device which can prevent the occurrence of defective display by obviating a warp of an insulating substrate and breaking of a tape carrier package TCP and a chip-on-film COF which are caused by the difference in thermal expansion coefficient between an insulating substrate and a multi-layered printed circuit board which constitutes the display panel or the thermal deformation attributed to the difference in thermal expansion coefficient or a residual stress when the multi-layered printed circuit board is used for transmission of signals to a display panel.

The multi-layered printed circuit board includes at least one unit which is formed by stacking and fixing (laminating) conductive thin layers which are insulated by at least one base sheet which is formed by impregnating an insulating sheet fiber member made of glass fibers or the like with resin and one or a plurality of units are laminated to form the multi-layered printed circuit board. The conductive thin layer is subjected to patterning in a suitable treatment so that transmission paths for signals and terminals are formed. There may be a case that an insulation layer is formed such that the insulation layer covers a conductive thin layer formed on an outermost surface.

To achieve the above object, at a portion of a sheet fiber member formed in the base sheet which constitutes the unit of the above-mentioned multi-layered printed circuit board, imperfect connection parts for attenuating elongation and shrinkage and deformation attributed to the thermal expansion and shrinkage and a residual stress of the printed circuit board in plane of the base sheet are formed. This imperfect connection parts absorb particularly the elongation and shrinkage of the multi-layered printed circuit board in the longitudinal direction in plane of the sheet fiber member and suppresses the deformation of the multi-layered printed circuit board caused by the thermal deformation and the residual stress. The imperfect connection parts are formed in manufacturing steps of the multi-layered printed circuit board such that slits are formed by fine blanking before or after impregnating the sheet fiber member with resin or local stretching or a partial separation is applied to the sheet fiber member by punching. Accordingly, it is possible to locally decrease the strength of the multi-layered printed circuit board.

Here, the above-mentioned slit forming and the punching include a case in which the sheet fiber member is completely separated as well as a case in which portions of the fibers are connected to each other. These imperfect connection parts are arranged such that portions which perform absorption of elongation and shrinkage of the sheet fiber member and portions which perform relaxation of stress of the sheet fiber member are arranged to satisfy the demands of respective individual products while maintaining the function of the multi-layered printed circuit board as the constitutional material as a whole. Hereinafter, the structure of the display device according to the present invention is described.

The display device (1) includes:

an insulating substrate which has a large number of electrodes, wherein a plurality of leads which supply signals for image display to the respective electrodes are formed on an end periphery of the insulating substrate;

a multi-layered printed circuit board which is arranged along the end periphery of the insulating substrate and includes wiring for transmitting the signals for image display along the end periphery of the insulating substrate; and a plurality of printed circuit boards for bridging which are arranged in parallel along the end periphery of the insulating substrate, wherein for every one of a plurality of groups of leads formed by dividing the plurality of leads along the end periphery of the insulating substrate, each printed circuit board bridges the wiring of the multi-layered printed circuit board with one of the plurality of groups of leads.

The multi-layered printed circuit board includes at least a unit which has at least one base sheet which is formed by impregnating an insulating sheet fiber member with resin and conductive layers which are stacked and fixed to the base sheet and are insulated from each other by the base sheet, and imperfect connection parts which attenuate the elongation and the shrinkage of the multi-layered printed circuit board in the longitudinal direction in plane of the base sheet are formed at portions of the sheet fiber member of the base sheet. In the multi-layered printed circuit board in which the sheet fiber member is embedded, the imperfect connection parts of the sheet fiber member are also referred to as discontinuity of the sheet fiber member or the interrupted portions of the sheet fiber member.

The display device (2) includes the structure of the above-mentioned display device (1). In the display device (2), the imperfect connection parts extend between the printed circuit boards for bridging and in the direction which connects end peripheries of the printed circuit boards for bridging along the widthwise direction.

The display device (3) includes the structure of the above-mentioned display device (1). In the display device (3), the imperfect connection parts are constituted of the imperfect connection parts of a first row which are intermittently arranged in the longitudinal direction of the multi-layered printed circuit board and are positioned at the end periphery of a side remote from the insulating substrate and the imperfect connection parts of a second row which are intermittently arranged in the longitudinal direction of the multi-layered printed circuit board and are positioned at the end periphery of a side close to the insulating substrate, and the imperfect connection parts of the first row are formed between arrays of the printed circuit boards for bridging and the imperfect connection parts of the second row are formed at positions where the printed circuit boards for bridging are overlapped to the multi-layered printed circuit board.

The display device (4) includes the structure of the above-mentioned display device (3). In the display device (4), between the imperfect connection parts of the first row and the imperfect connection parts of the second row along the longitudinal direction of the multi-layered printed circuit board, the insulating sheet fiber member is continued without being deformed.

The display device (5) includes the structure of the above-mentioned display device (3) or the above-mentioned display device (4). In the display device (5), the imperfect connection parts of the first row and the imperfect connection parts of the second row are arranged in a staggered manner along the longitudinal direction of the multi-layered printed circuit board.

The display device (6) includes the structure of any one of the above-mentioned display devices (3) to (5). In the display device (6), between the imperfect connection parts of the first row and the end periphery of the multi-layered printed circuit board at a side remote from the insulating substrate, an area where the insulating sheet fiber member is formed continuously without being deformed is provided.

The display device (7) includes the structure of any one of the above-mentioned display devices (1) to (6). In the display device (7), a semiconductor chip is mounted on the printed circuit board for bridging.

The display device (8) includes the structure of any one of the above-mentioned display devices (1) to (7). In the display device (8), another insulating substrate different from the insulating substrate is arranged to face the insulating substrate in an opposed manner, these insulating substrates have respective peripheries thereof adhered to each other, and liquid crystal is filled and sealed between these insulating substrates. Accordingly, the display device (8) is provided as a so-called liquid crystal display device.

Further, the structure of the display device according to the present invention is further described as follows. For example, in a display device including an insulating substrate which has a main surface on which a plurality of electrodes contributing to an image display operation are formed, wherein a plurality of leads which supply signals to the plurality of respective electrodes are arranged in parallel along at least one side of the main surface of the insulating substrate, a multi-layered printed circuit board which has wiring for transmitting the signals along at least one side of the main surface of the insulating substrate, and a plurality of printed circuit boards which respectively bridge a distance between the multi-layered printed circuit board and at least one side of the main surface of the insulating substrate and supply signals to at least one of groups of the leads which are formed in a divided manner at least along one side of the main surface of the insulating substrate from the multi-layered printed circuit board, the multi-layered printed circuit board has a laminated structure which includes at least a base sheet formed of an insulating sheet fiber member impregnated with resin and a conductive layer formed on the base sheet and insulated from the base sheet, the extension direction of the base sheet is arranged along at least one side of the main surface of the insulating substrate, and a plurality of discontinued areas in the extending direction of the base sheet are formed in the insulating sheet fiber member.

The display device may be configured such that films made of the resin are formed on the discontinued areas of sheet fiber member formed on the base sheet of the multi-layered printed circuit board and sections of the sheet fiber member which are divided along the extending direction of the base sheet are joined with flexibility. A shape of the discontinued areas of sheet fiber member does not obstruct the practice of the present invention in both of a case in which the sheet fiber member is divided along the direction which traverses the extending direction of the base sheet and a case in which the sheet fiber member is not separated completely (in the latter case, the discontinued areas are extended from an end portion to a middle portion of the sheet fiber member thus forming a gulf shape or are extended remote from the end portion of the sheet fiber member thus forming an island shape.

The elongation and shrinkage and the strength of the multi-layered printed circuit board depend on the specification and the number of lamination of base sheets which are formed by impregnating woven fabric or unwoven fabric made of glass fibers or the like with epoxy resin or the like (also referred to prepreg). That is, "prepeg" denotes a sheet-form member obtained by impregnating a fiber sheet with resin. By applying slit forming or punching to the base sheet, portions of the woven fabric or the non-woven fabric made of fibers which suppress the thermal deformation such as thermal expansion and the thermal shrinkage are separated. Although a thermal deformation quantity of the multi-layered printed circuit board in this separating direction slightly increases, a warp of the multi-layered printed circuit board attributed to a residual stress after cooling can be reduced.

In using a conductive thin layer as the base sheet, that is, in forming the base sheet of the multi-layered printed circuit board by laminating a copper foil to the base sheet, due to heat added to the base sheet at the time of laminating the copper foil, the resin impregnated in the base sheet is dissolved and filled into the slit formed portions or the punched portions. Accordingly, succeeding steps such as patterning of the copper foil, stacking for multi-layered structure can be performed substantially in the same manner as the multi-layered printed circuit board using the usual base sheet. Further, no restriction is imposed on patterning (layout) of wiring.

Although the above-mentioned slit forming and punching are basically performed to divide the multi-layered printed circuit board in the longitudinal direction, depending on the application or use of the multi-layered printed circuit board, the mode of forming can be properly changed. In case of the multi-layered printed circuit board which is formed by laminating a plurality of base sheets, the slit forming or the punching is applied to portions of or the whole base sheet so that the specification such as the reduction of the residual stress or warp after mounting parts which are imposed on the multi-layered printed circuit board as requirements can be satisfied. Further, this structure of the multi-layered printed circuit board is also applicable to a so-called hybrid printed circuit board which combines the multi-layered printed circuit board and the flexible printed circuit board.

Further, this multi-layered printed circuit board is applicable to a display device using the above-mentioned liquid crystal panel, organic EL panel or plasma panel, various display devices using similar display panels, or other electronic equipment using a multi-layered printed circuit board. This multi-layered printed circuit board is particularly useful for the display device having a large screen size.

The present invention is not limited to the above-mentioned constitution and constitution of embodiments described later. As described above, the present invention is applicable to other display device including the organic EL display devices and various modifications can be conceived without departing from the technical concept of the present invention.

BRIEF DESCRIPTION OF THE DRAWINGS

FIG. 1A and FIG. 1B are schematic views for explaining the constitution of essential parts of the first embodiment of the display device according to the present invention, wherein FIG. 1A is a plan view of essential parts of the data-line side of an active matrix substrate of a liquid crystal panel and a multi-layered printed circuit board which are connected by a printed circuit board for bridging (illustrated as a tape carrier package) and FIG. 1B is a plan view of the multi-layered printed circuit board per se;

FIG. 2A and FIG. 2B are schematic views for explaining the constitution of essential parts of the second embodiment of the display device according to the present invention, wherein FIG. 2A is a plan view of the data-line side of an active matrix substrate of a liquid crystal panel and a multi-layered printed circuit board which are connected by tape carrier packages and FIG. 2B is a plan view of the multi-layered printed circuit board per se;

FIG. 3A and FIG. 3B are schematic views for explaining the constitution of essential parts of the third embodiment of the display device according to the present invention, wherein FIG. 3A is a plan view of the data-line side of an active matrix substrate of a liquid crystal panel and a multi-layered printed circuit board which are connected by tape carrier packages and FIG. 3B is a plan view of the multi-layered printed circuit board per se;

FIG. 4 is an explanatory view of a manufacturing method of a multi-layered printed circuit board which constitutes the display device described in the first embodiment of the present invention;

FIG. 5 is an explanatory view of a manufacturing method of a multi-layered printed circuit board which constitutes the display device described in the second embodiment of the present invention;

FIG. 10A and FIG. 10B are explanatory views showing one example of a state in which the multi-layered printed circuit board is connected to an active matrix substrate of the liquid crystal panel which constitutes the liquid crystal display device using tape carrier packages, wherein FIG. 10A is a perspective view of essential parts thereof and FIG. 10B is a cross-sectional view taken along a line A–A' in FIG. 10A;

DETAILED DESCRIPTION

Figure 1A:
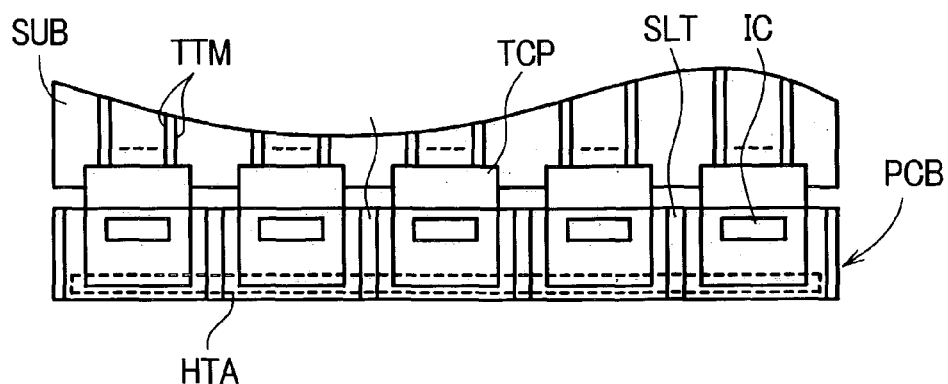
Figure 1B:
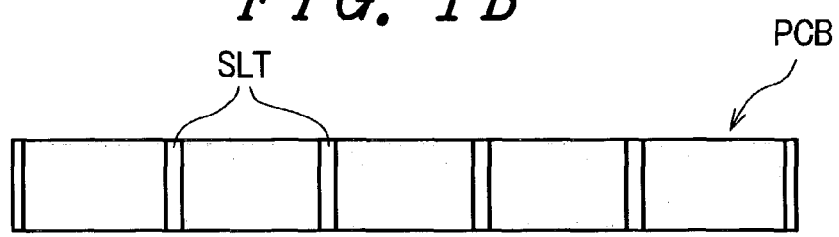

Embodiments of the present invention are explained in detail in conjunction with drawings of the embodiments to which the liquid crystal display device of the present invention is applied. FIG. 1 is a schematic view for explaining the constitution of an essential part of the first embodiment of the display device according to the present invention. That is, FIG. 1A is a plan view of an essential part in a state that a data line side of an active matrix substrate of a liquid crystal panel and a multi-layered printed circuit board are connected using tape carrier packages as printed circuit boards for bridging and FIG. 1B is a plan view of the multi-layered printed circuit board. In FIG. 1A and FIG. 1B, reference symbol PCB indicates the multi-layered printed circuit board, reference symbol TCP indicates the tape carrier packages, and reference symbol SUB indicates the active matrix substrate which constitutes a liquid crystal panel. The multi-layered printed circuit board PCB is constituted such that a unit is formed by laminating copper foils to front and back surfaces of a plurality of base sheets which are formed by impregnating a woven fabric made of glass fibers with resin and by stacking base sheets and a copper foil having the same structure. In this multi-layered printed circuit board PCB, as imperfect connection parts for attenuating the elongation and shrinkage in the longitudinal direction of the multi-layered printed circuit board PCB, slits SLT are formed at a given interval in the longitudinal direction of the multi-layered printed circuit board.

On the active matrix substrate SUB, a large number of thin film transistors which are arranged in a matrix array are formed as active elements for selecting pixels of a liquid crystal panel. Reference symbol TTM indicates leads connected to data lines (also referred to as source lines or drain lines) of the thin film transistors. Although not shown in the drawing, on the multi-layered printed circuit board PCB, wiring which transmit various signals for display from an external signal source are formed, wherein output terminals which are branched from the above-mentioned wiring are formed for every group of a given number of data lines.

The output terminals of the multi-layered printed circuit board PCB and the leads TTM of the active matrix substrate SUB are connected by the tape carrier packages TCP which constitute printed circuit boards for bridging. At both ends of the tape carrier package TCP which mounts a semiconductor chip IC for driving on the printed circuit board, terminals which are respectively connected to the above-mentioned leads TTM and the output terminals of the multi-layered printed circuit board PCB are formed.

In the multi-layered printed circuit board PCB of this embodiment, each slit SLT is positioned between the tape carrier packages TCP which are to be mounted. The slit SLT is formed such that the slit SLT traverses the multi-layered printed circuit board TCB in the widthwise direction. As shown in FIG. 1A, one end of the tape carrier package TCP is connected to the output terminals of the multi-layered printed circuit board PCB in the vicinity of the end portion opposite to the active matrix substrate SUB, while the another end of the tape carrier package TCP extends over a side periphery of the multi-layered printed circuit board PCB, extends so as to overlap the active matrix substrate SUB, and is connected to the leads TTM.

In this embodiment, the semiconductor chip (drive circuit) IC is mounted on the tape carrier package TCP at a position close to the connection portion with the multi-layered printed circuit board PCB. This tape carrier package has a portion thereof ranging from a connection portion between the tape carrier package TCP and the leads TTM formed on the active matrix substrate SUB to a connection portion between the tape carrier package TCP and the multi-layered printed circuit board PCB bent substantially by 180°. Accordingly, the connection portion of the multi-layered printed circuit board PCB is, together with the semiconductor chip IC mounted on the taper carrier package TCP, folded onto a surface of the active matrix substrate SUB opposite to a surface on which the leads TTM are formed. Here, an area indicated by a dotted line in FIG. 1A indicates a pressurizing/heating area HTA for connecting the tape carrier packages TCP to the multi-layered printed circuit board PCB through an anisotropic conductive film (ACF). Although the imperfect connection part for attenuating the elongation and shrinkage of the multi-layered printed circuit board PCB along the longitudinal direction is formed as the so-called strip-like slit SLT, the shape of the imperfect connection part is not limited to the slit and a similar advantageous effect can be obtained even when the imperfect connection part is formed in a circular shape or in a rectangular shape, for example.

The slits SLT are continuously or intermittently formed in the widthwise direction of the multi-layered printed circuit board PCB. When the slits SLT are formed continuously in the widthwise direction, compared to a case in which the whole glass fibers which constitute a base sheet is completely cut traversing in the widthwise direction, it is preferable to form the slits SLT such that some fibers stride over the slits or the fibers are slackened at the slit portions. Even when the glass fibers (or a sheet fiber member close to the glass fibers) are not completely cut by these slits SLT, considerable portions can be discontinuously processed artificially. Further, in place of performing such blanking to the glass fibers or the sheet fiber member, so-called punching may be applied so as to deform the glass fibers or the fiber member at the above-mentioned imperfect connection part (for example, the fibers may be slackened or made fine).

Accordingly, with respect to the imperfect connection part of the above-mentioned multi-layered printed circuit board PCB (the printed circuit board on which a wiring pattern of two or more layers is stacked) in the display device according to the present invention, such a connection part is formed by partially lowering the rigidity of frame materials such as glass fibers or the fiber members which are contained in the base member (for example, by making the frame member easily deformed so as to absorb a force applied to the base member from the tape carrier package). These imperfect connection parts are formed as a plurality of discontinued areas which are spaced apart from each other in the hard (two-dimensional) expansion of the above-mentioned frame materials of the base member of the printed circuit board PCB.

On the other hand, even when the above-mentioned glass fibers or fiber member which constitute the frame materials are completely separated in discontinued area, these frame materials are impregnated with resin. In the assembling step of the printed circuit board PCB, the base member (including the above-mentioned frame material impregnated with resin) and conductive layers which are formed above and below the base member are compressed in the thickness direction of the base member while being heated and, thereafter, the whole printed circuit board PCB is cooled. By applying the above-mentioned heating and pressurizing treatment to the base member and the conductive layers above and below the base member, the resin which is adhered to the surface of the frame material due to the impregnation treatment flows into the above-mentioned discontinued area (portions where the glass fibers or the fiber material are no more present) and is solidified by the succeeding cooling of the whole printed circuit board PCB. Accordingly, even with respect to the printed circuit board PCB including the discontinued area where the frame material is completely separated, this discontinued area is clogged by the resin and hence, it is possible to prevent the decrease of the strength. To the contrary, it is possible to obtain the proper flexibility (sufficient to absorb a force applied to the discontinued area from the tape carrier package, for example) in the discontinued area. Such an advantageous effect can be sufficiently obtained not only in the case that the discontinued area is formed in the above-mentioned slit SLT shape but also in the case that the discontinued area is formed in a circular shape or in a rectangular shape. Further, such an advantageous effect can be sufficiently obtained even when the discontinued area completely traverses the printed circuit board PCB in the widthwise direction thereof.

Due to such a constitution, the elongation and shrinkage attributed to the difference of thermal expansion coefficient or the elongation and shrinkage attributed to a residual stress in the multi-layered printed circuit board PCB, the tape carrier package TCP, the active matrix substrate SUB, an anisotropic conductive film ACF and the like can be absorbed by the slits SLT and hence, an undesired excessive force is not applied to the connection portion between the tape carrier package TCP and the leads TTM of the multi-layered printed circuit board PCB and the active matrix substrate SUB.

Further, the short slits which are formed in the above-mentioned mode may be arranged in a plural number in the widthwise direction of the multi-layered printed circuit board PCB or the short slits may be arranged in parallel in a plural number. Punching is a forming method for lowering the strength by locally deforming the glass fibers by pressing without cutting the glass fibers basically. Also in this case which adopts the punching process, in the same manner as the previously mentioned case, the punching is not limited to a case in which the punching is continuously performed in the widthwise direction. That is, the punching in a circular shape, an elliptical shape or a strip shape can be also performed in a plurality of rows in the widthwise direction. Further, the punching may be performed in a plural number in parallel.

Further, the short slits SLT having a length which can not completely traverse the multi-layered printed circuit board PCB in the widthwise direction may be formed in a so-called row of slits by arranging a plurality of slits SLT along the long-axis (longitudinal) direction of the multi-layered printed circuit board PCB as described above. Further, this row of slits may be formed in a plural number in parallel along the widthwise direction of the multi-layered printed circuit board PCB. The above-mentioned discontinued area may be formed not only by the separation (including partial separation) of frame material (fibers or the like) contained in the base member of the multi-layered printed circuit board PCB, but also by the plastic deformation of the frame material. In the discontinued area formed by the plastic deformation of the frame material, provided that at least a portion of the frame material present in the area is elongated further than other areas (by receiving the plastic deformation), a case in which the frame material is not separated at all is also considered.

As one technique of the plastic deformation of the frame material, the punching is known. This punching is so-called squeezing in which the printed circuit board and the base member are locally collapsed or deformed by pressure using a work and the strength of the printed circuit board and the base member is partially reduced without cutting the frame material such as glass fibers or the like contained in the printed circuit board or the like. Due to the plastic deformation of glass fibers caused by the punching, it is also possible to provide a row of slits consisting of the imperfect connection parts (including discontinued areas formed in the base member of the printed circuit board) which are arranged in parallel along the longitudinal direction of the multi-layered printed circuit board as mentioned above. The row of imperfect connection parts which are arranged in the longitudinal direction of the multi-layered printed circuit board may be formed, in place of performing the punching of strip-like punching continuously along this direction, by performing punching in a circular shape, in an elliptical shape or in a strip shape. Further, in any one of these cases, the rows of the imperfect connection parts can be arranged in parallel in a plural numbers.

According to this embodiment, the defective connection between the output terminals of the multi-layered printed circuit board PCB and the terminals of the tape carrier packages TCP or the occurrence of displacement or the disconnection of wiring or terminals in the vicinity of the connection portions, the peeling of wiring and terminals can be suppressed. As a result, the occurrence of defective display attributed to the change of temperature and humidity in the using environment can be prevented whereby it is possible to provide the liquid crystal display device having high quality and high reliability.

Figure 2A:
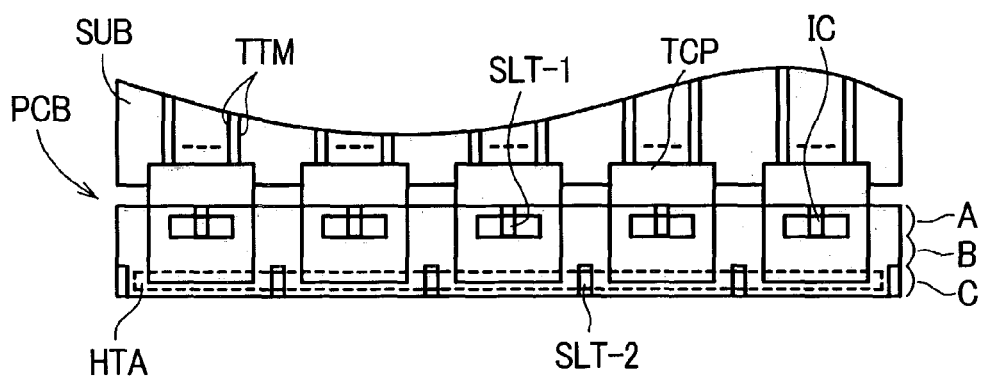
Figure 2B:
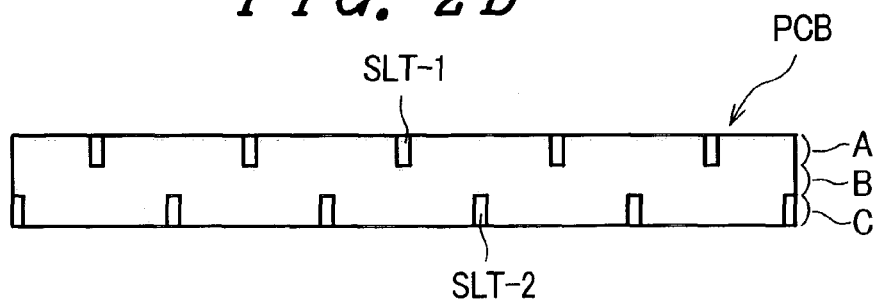

FIG. 2 is a schematic view for explaining the constitution of an essential part of the second embodiment of the display device according to the present invention, wherein FIG. 2A is a plan view of an essential part showing a state in which a data line side of an active matrix substrate of a liquid crystal panel and a multi-layered printed circuit board are connected to each other using tape carrier packages as printed circuit boards for bridging and FIG. 2B is a plan view of the multi-layered printed circuit board. In FIG. 2, symbols equal to those used in the FIG. 1 indicate identical functional portions. This embodiment is substantially characterized by forming slits which start from end peripheries of the multi-layered printed circuit board PCB in the widthwise direction and terminate inside the multi-layered printed circuit board PCB in a staggered manner (that is, in a zigzag manner) along respective end peripheries of the multi-layered printed circuit board PCB.

In FIG. 2A and FIG. 2B, slits SLT-1 which are formed at the active matrix substrate SUB side of the multi-layered printed circuit board PCB have a length which is about ⅓ of a width of the multi-layered printed circuit board PCB, while slits SLT-2 which are formed on the side opposite to the active matrix substrate SUB side of the multi-layered printed circuit board PCB also have a length which is about ⅓ of the width of the multi-layered printed circuit board PCB. Accordingly, in an area B which is disposed between the longitudinal area A and the longitudinal area C of the multi-layered printed circuit board PCB where the slits SLT-1, SLT-2 are formed and has the width which is ⅓ of the width of the multi-layered printed circuit board PCB, no slits are formed. Further, in this embodiment, the slits SLT-1 which are formed on the active matrix substrate SUB side of the multi-layered printed circuit board PCB are positioned at the center portion of the mounting areas of the tape carrier packages TCP. That is, the slits SLT-1 are positioned right below semiconductor chips IC mounted on the tape carrier packages TCP. Accordingly, the elongation and shrinkage of the multi-layered printed circuit board PCB at portions thereof to which the semiconductor chips IC are overlapped can be suppressed more effectively. With respect to other constitutions including the application of punching in place of slits, they are substantially equal to those explained in conjunction with FIG. 1 and hence, their repeated explanation is omitted.

In the constitution of this embodiment, at the time of connecting the tape carrier packages TCP to the multi-layered printed circuit board PCB, to an intermediate portion between the pressurizing/heating area HTA and the active matrix substrate SUB, neither the slit formed portions nor the punched portions which constitute the imperfect connecting parts are formed and hence, a thermal expansion quantity of the multi-layered printed circuit board PCB when the pressurizing/heating area HTA is heated and a thermal shrinkage quantity of the multi-layered printed circuit board PCB when heat is removed can be suppressed. Accordingly, it is possible to reduce the generated residual stress as a whole of the multi-layered printed circuit board. With respect to other advantageous effects of this embodiment, they are substantially equal to those of the first embodiment.

Figure 3A:
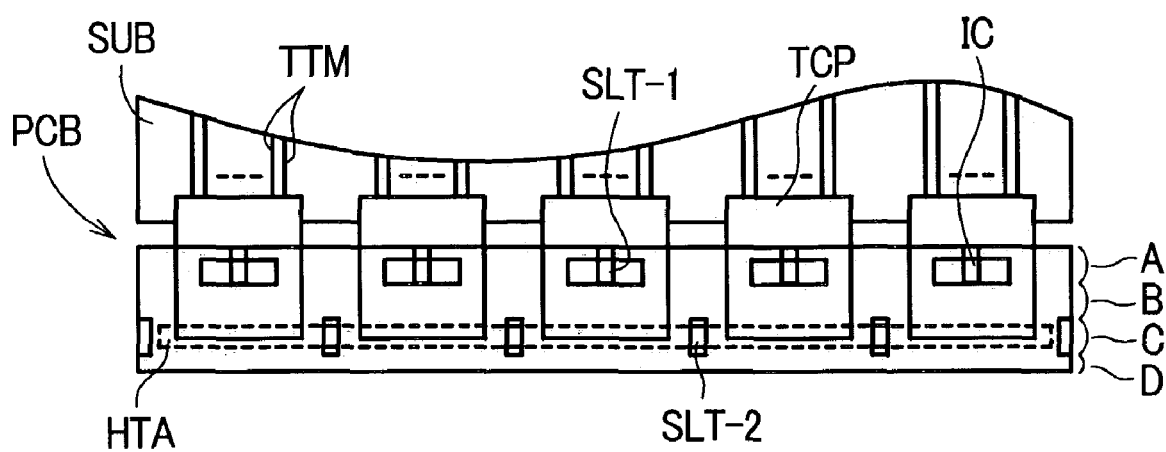
Figure 3B:
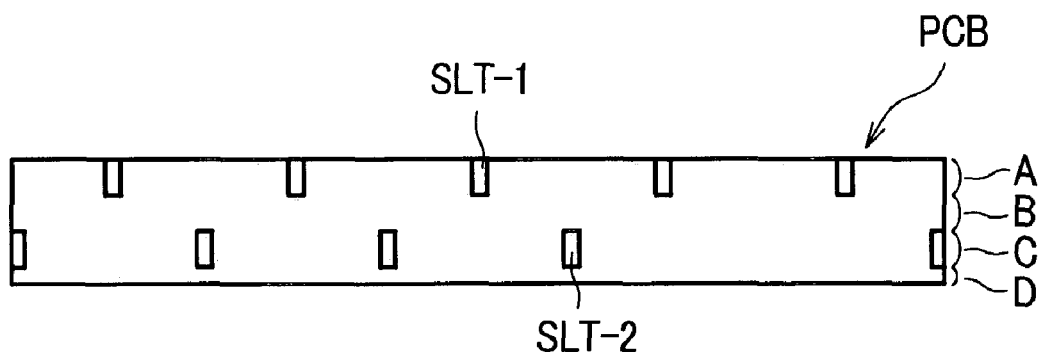

FIG. 3 is a schematic view for explaining the constitution of an essential part of the third embodiment of the display device according to the present invention, wherein FIG. 3A is a plan view of an essential part showing a state in which a data line side of an active matrix substrate of a liquid crystal panel and a multi-layered printed circuit board are connected to each other using tape carrier packages as printed circuit boards for bridging and FIG. 3B is a plan view of the multi-layered printed circuit board. In FIG. 3A and FIG. 3B, symbols equal to those used in FIG. 2 indicate identical functional portions. This embodiment is substantially characterized by forming, slits SLT-1 which start from one end periphery in the widthwise direction and terminate inside the active matrix substrate SUB side of the multi-layered printed circuit board PCB and slits SLT-2 which start from a position retracted from another end periphery in the widthwise direction and terminate inside the multi-layered printed circuit board PCB at another end periphery in the widthwise direction of the multi-layered printed circuit board in a staggered manner in the same manner as FIG. 2.

That is, based on the technical concept of the second embodiment, at the end periphery which is positioned at the side opposite to the active matrix substrate SUB of the multi-layered printed circuit board PCB, an area D where slits are not formed is provided along the longitudinal direction of the multi-layered printed circuit board PCB. The widths of an area A, an area B and an area C are respectively about ⅓ of the width of the multi-layered printed circuit board PCB excluding the area D. In this embodiment, the area D where no forming is applied to the imperfect connection portion is added to the area B where no forming is applied to the imperfect connection portions in the second embodiment. Accordingly, a thermal expansion quantity of the multi-layered printed circuit board PCB when the pressurizing/heating area HTA is heated and a thermal shrinkage quantity of the multi-layered printed circuit board when heat is removed which are explained in conjunction with the embodiment 2 can be further suppressed. Accordingly, it is possible to reduce the generated residual stress as a whole of the multi-layered printed circuit board PCB. With respect to other constitutions of this embodiment including the application of punching in place of the slits, they are substantially equal to those of the first and second embodiments and hence, their repeated explanation is omitted.

Next, a manufacturing process of the multi-layered printed circuit board adopted by the display device according to the present invention is explained. FIG. 4 is an explanatory view of the first embodiment of the manufacturing method of a multi-layered printed circuit board which constitutes the display device of the present invention. Here, although an example, which provides slits, as imperfect connection portions is described in this embodiment, the same goes for the imperfect connection parts formed by punching and hence, the latter case is not explained particularly. Further, although this embodiment shows the first example of processes for manufacturing a unit which has both surfaces thereof laminated with copper foils, it is needless to say that a unit can have one surface thereof laminated with a copper foil. Here, in the explanation hereinafter, the process is indicated by P-xx.

In FIG. 4, a woven fabric made of glass fibers which eventually constitutes the base sheet is reeled out from a roll TEX and is made to pass through a slit forming machine SLTR having a given slit mold thus forming the slits SLT (P-1A). The woven fabric in which the slits are formed is made to pass through a resin vessel so that the woven fabric is impregnated with resin RGN (P-2A). The resin-impregnated woven fabric is made to pass through a drier HTR to be dried (P-3A). Through this drying step, the slits SLT are filled with resin and the woven fabric exhibits a single sheet in appearance. The dried elongated sheet is cut into a given size by a cutter CUTR to produce the base sheet PPL (P-4A).

In conformity with the characteristics of specification requested on this base sheet PPL, a given number of base sheets PPL are stacked and copper foils ECC are laminated to both of front and back surfaces thereof (P-5A), pressurizing/heating treatment is applied to the stacked body using a laminator H/P (P-6A) thus obtaining a unit D-PCB which has both surfaces thereof laminated with the copper foils.

FIG. 5 is an explanatory view of the second embodiment of the manufacturing method of a multi-layered printed circuit board which constitutes the display device of the present invention. Although an example which provides slits as imperfect connection portions is described in this embodiment also, the same goes for the imperfect connection parts formed by punching and hence, the latter case is not explained particularly. Further, although this embodiment shows the second example of processes for manufacturing a unit which has both surfaces thereof laminated with copper foils, it is needless to say that a unit can have one surface thereof laminated with a copper foil.

In FIG. 5, a woven fabric made of glass fibers which eventually constitutes the base sheet is reeled out from a roll TEX and is made to pass through a resin vessel so that the woven fabric is impregnated with resin RGN (P-1B). The resin-impregnated woven fabric is made to pass through a drier HTR to be dried (P-2B). The dried elongated sheet is cut into a given size by a cutter CUTR (P-3B). The cut sheet is made to pass through the slit forming machine SLTR to form slits SLT thus producing the base sheet PPL (P-4B).

Thereafter, in the same manner as the process explained in conjunction with FIG. 4, in conformity with the characteristics of specification requested on the base sheet PPL, a given number of base sheets PPL are stacked and copper foils ECC are laminated to both of front and back surfaces thereof (P-5B), pressurizing/heating treatment is applied to the stacked body using a laminator H/P (P-6B) thus obtaining a unit D-PCB which has both surfaces thereof laminated with the copper foils. In adopting this process, by mounting a dedicated mold having slit forming portions which satisfy respective specifications of the multi-layered printed circuit board to the slit forming machine SLTR, irrespective of the number of materials cut out from the elongated sheet, it is possible to manufacture the base sheets having given slits.

In performing the pressurizing/heating treatment using the laminator H/P shown in FIG. 4 and FIG. 5, the resin impregnated into the fibers is dissolved and filled into portions which are subjected to slit forming (or punching) so that a plurality of base sheets are integrally formed. Accordingly, irrespective of the presence of portions which are subjected to slit forming (or punching), wiring can be formed so that the completed multi-layered printed circuit board can be handled in the same manner as the usual multi-layered printed circuit board. Further, with respect to a plurality of base sheets, by combining shapes, forming positions, distributions of slit forming or punching, sheets having the slits and sheets having no slits, it is possible to obtain the multi-layered printed circuit board having desired characteristics.

Figure 6:
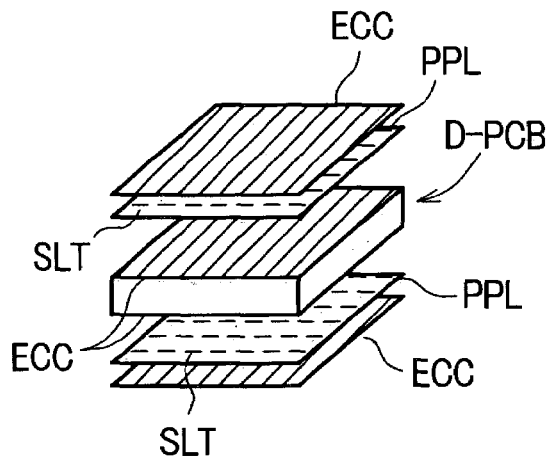
FIG. 6 is a developed perspective view for schematically explaining one structural example of the multi-layered printed circuit board which uses a unit manufactured in FIG. 4 or FIG. 5.

FIG. 6 is a developed perspective view for schematically explaining one structural example of the multi-layered printed circuit board using the unit manufactured by the method shown in FIG. 4 or FIG. 5. Here, although the multi-layered printed circuit board is configured to have a simple rectangular shape, actual products have given shapes. The multi-layered printed circuit board shown in FIG. 6 is a four-layered multi-layered printed circuit board which is formed such that to an upper surface and a lower surface of a unit D-PCB to which copper foils are laminated respectively, another copper foils ECC are respectively overlapped by way of the base sheets PPL.

Figure 7:
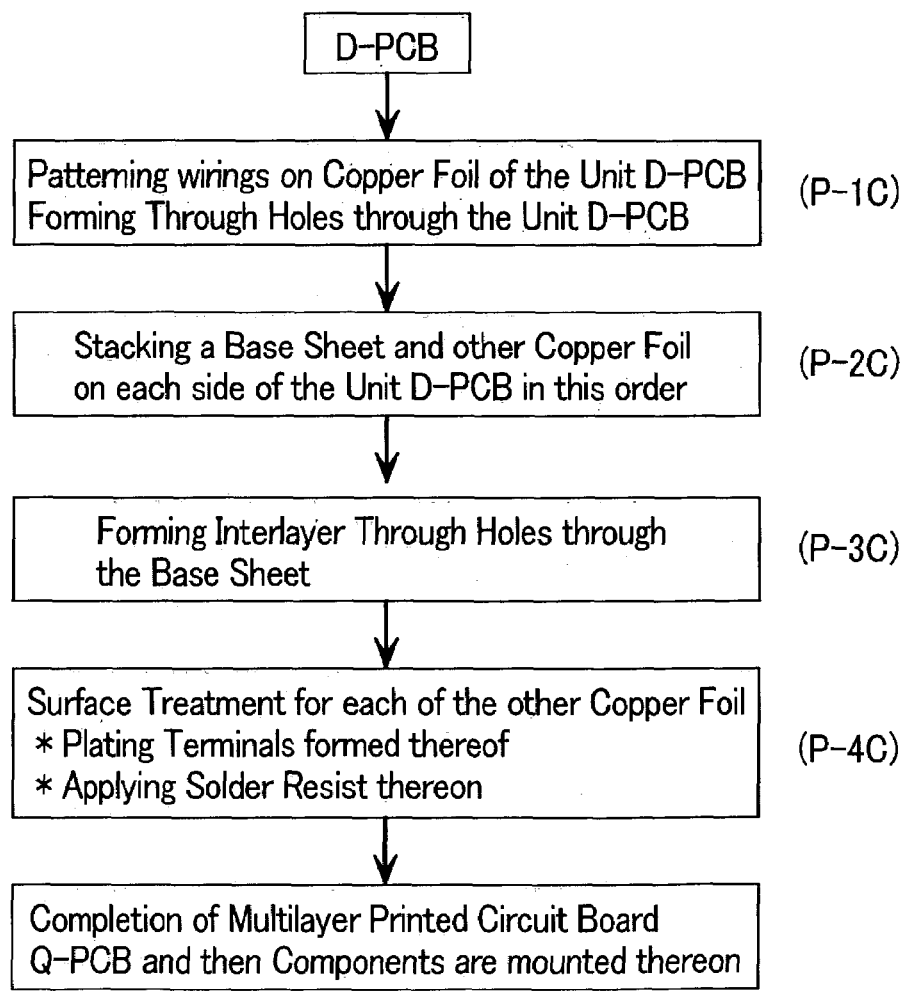
FIG. 7 is an explanatory view of a process for manufacturing four-layer multi-layered printed circuit board shown in FIG. 6.

FIG. 7 is an explanatory view of a process for manufacturing the four-layered multi-layered printed circuit board which is shown in FIG. 6. In FIG. 7, a wiring pattern and through holes are formed on the unit D-PCB having both surfaces thereof laminated with copper (P-1C). Next, a base sheet PPL and a copper foil are laminated to each surface (P-2C). Patterning of wiring and formation of through holes are performed again (P-3C), and plating of surfaces of terminals and application of a solder resist and the like are performed (P-4C) thus obtaining the multi-layered printed circuit board Q-PCB having the four-layered wiring. This-multi-layered printed circuit board Q-PCB is mounted on the above-mentioned liquid crystal panel.

Figure 8:
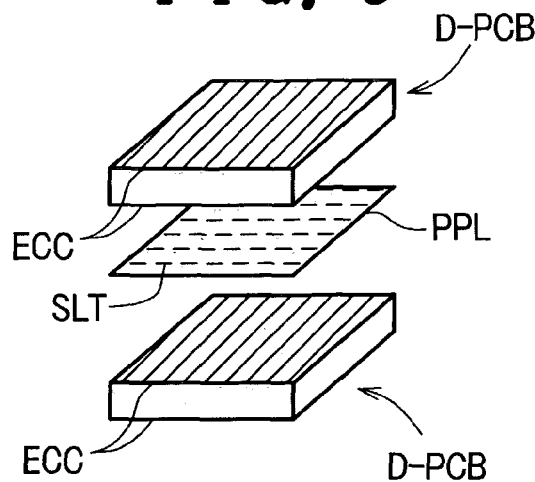
FIG. 8 is a developed perspective view for schematically explaining another structural example of the multi-layered printed circuit board which uses a unit manufactured in FIG. 4 or FIG. 5.

FIG. 8 is a developed perspective view for schematically explaining another structural example of the multi-layered printed circuit board using the unit manufactured by the method shown in FIG. 4 or FIG. 5. Here, although the multi-layered printed circuit board is configured to have a simple rectangular shape, actual products have given shapes.

The multi-layered printed circuit board shown in FIG. 8 is a four-layered multi-layered printed circuit board which is formed such that between two units D-PCB each of which has both surfaces thereof laminated with copper foils respectively, a base sheet PPL is interposed thus producing the four-layered multi-layered printed circuit board. Here, only one of two units D-PCB may be formed of the unit manufactured by the method explained in conjunction with FIG. 4 or FIG. 5.

Figure 9:
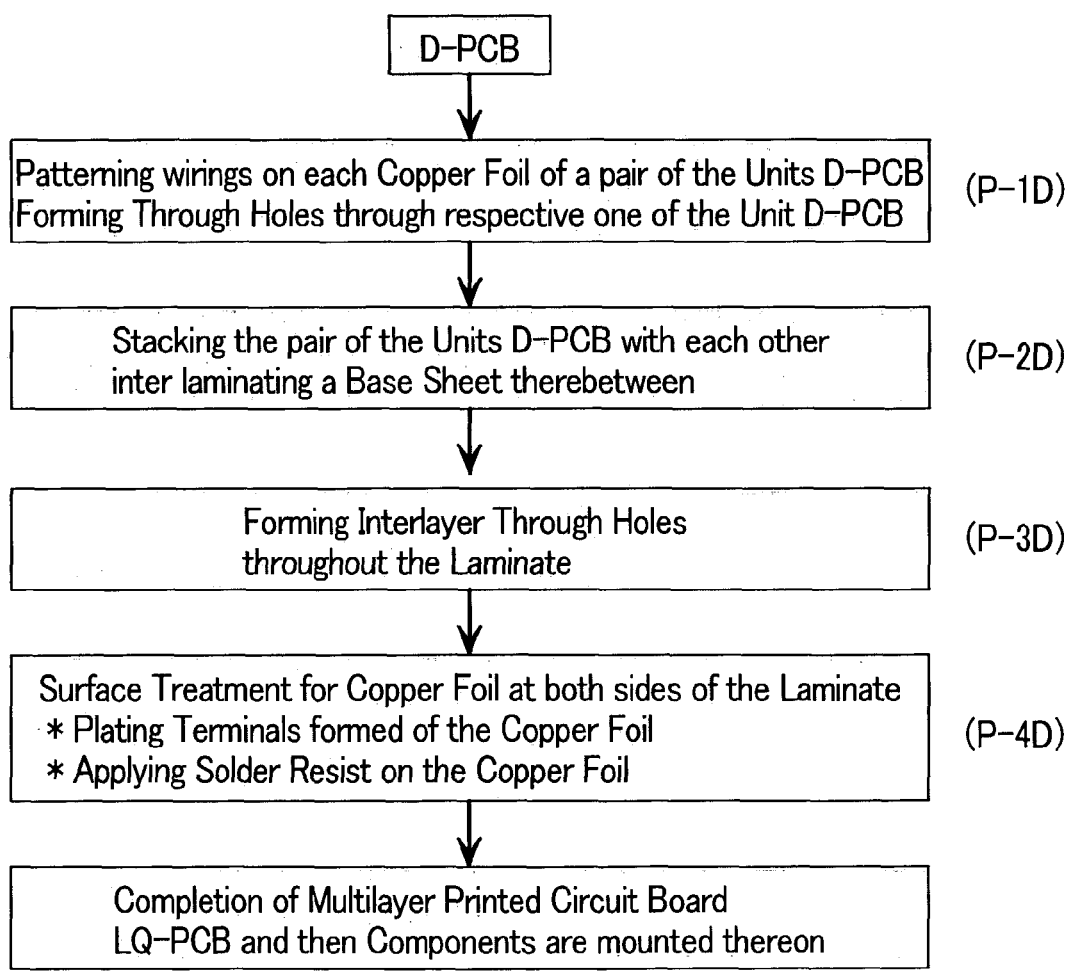
FIG. 9 is an explanatory view of a process for manufacturing four-layer multi-layered printed circuit board shown in FIG. 8.

FIG. 9 is an explanatory view of a process for manufacturing the four-layered multi-layered printed circuit board which is shown in FIG. 8. In FIG. 9, a wiring pattern and through holes are formed on two units D-PCB each of which has both surfaces thereof laminated with copper (P-1D). Next, two units D-PCB are laminated to each other while interposing the base sheet PPL therebetween (P-2D). Patterning of wiring and formation of through holes are performed (P-3C), and plating of surfaces of terminals and application of a solder resist and the like are performed (P-4D) thus obtaining the multi-layered printed circuit board Q-PCB having the four-layered wiring. This multi-layered printed circuit board Q-PCB is connected to the above-mentioned liquid crystal panel using a tape carrier package TCP.

Figure 10A:
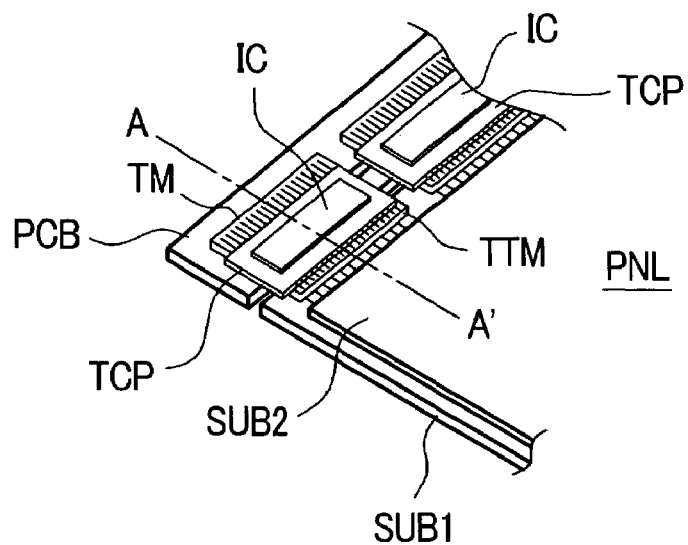
Figure 10B:
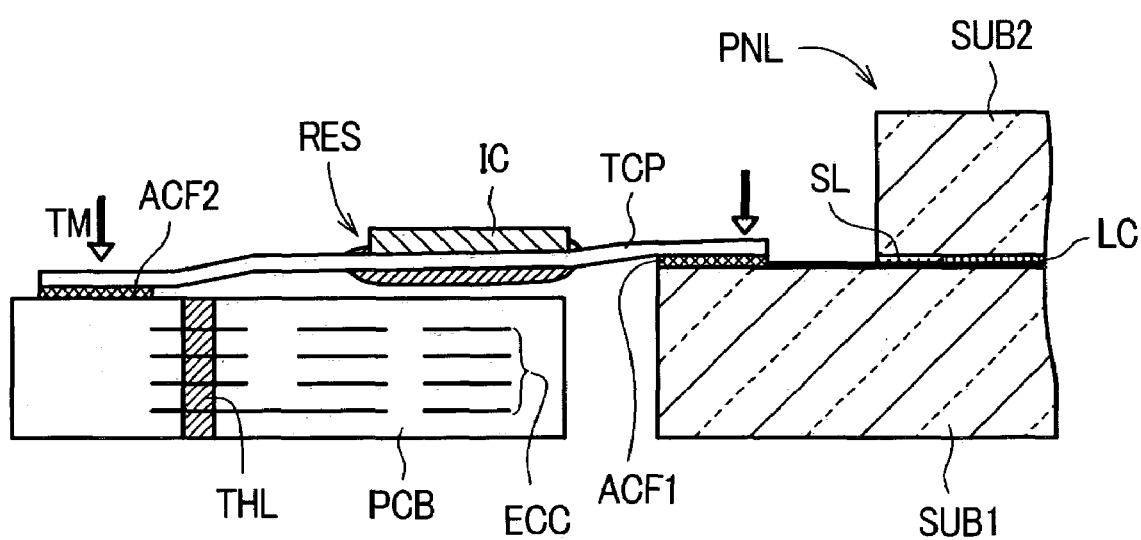

Then, the schematic constitution of the specific example of the display device which uses the above-mentioned multi-layered printed circuit board is explained. FIG. 10 is an explanatory view of an example showing a state in which to an active matrix substrate SUB1 of a liquid crystal panel which constitutes a liquid crystal display device, a multi-layered printed circuit board is connected using tape carrier packages TCP. FIG. 10A is a perspective view of an essential part and FIG. 10B is a cross-sectional view taken along a line A–A' in FIG. 10A. In FIG. 10, on at least one side of the liquid crystal panel PNL where a peripheral portion of the active matrix substrate SUB1 is projected from an end portion of a color filter substrate SUB2 which is overlapped to the active matrix substrate SUB1, the multi-layered printed circuit board PCB and a peripheral portion of the active matrix substrate SUB1 are electrically connected by tape carrier packages TCP.

On the tape carrier package TCP, an integrated circuit device (a semiconductor chip) which drives the liquid crystal panel PNL is mounted. The integrated circuit device IC receives clock signals or data signals transmitted from the multi-layered printed circuit board PCB through input terminals TM mounted on the tape carrier packages TCP and generates drive signals for the liquid crystal panel PNL in response to the clock signals or the data signals. The drive signals are supplied to the liquid crystal panel PNL from leads TTM mounted on the active matrix substrate through wiring layers of the tape carrier packages TCP and groups of lines of the active matrix substrate SUB1.

Between output terminals (wiring layers not shown in the drawing) of the tape carrier packages TCP and the leads TTM of the active matrix substrate, anisotropic conductive films (ACF1) are inserted and, at the same time, the anisotropic conductive films ACF1 are melt by heating while applying pressure to them in an arrow direction shown in FIG. 10B from an upper side of the leads TTM (tape carrier package TCP side) so as to fix them together. Between input terminals TM of the tape carrier packages TCP and a wiring layer of the multi-layered printed circuit board PCB (not shown in the drawing), anisotropic conductive films ACF2 are inserted and, at the same time, the anisotropic conductive films ACF2 are melt by heating while applying pressure to them in an arrow direction shown in FIG. 10B from an upper side of the multi-layered printed circuit board PCB (input terminal TM side of the tape carrier package TCP) so as to fix them together.

To prevent erosion of the electric connection portions between the wirings provided to the tape carrier packages TCP and the semiconductor chip IC, a resin film RES is applied to the peripheries of the semiconductor chips IC and back sides of portions of the tape carrier packages TCP on which the semiconductor chips IC are mounted. Further, on the back surfaces of the tape carrier packages TCP (surfaces opposite to the surfaces on which the semiconductor chips IC are mounted) are slightly floated (spaced apart) from upper surfaces of the active matrix substrate SUB1 and the multi-layered printed circuit board PCB except for portions which are connected to the active matrix substrate SUB1 and the multi-layered printed circuit board PCB by the anisotropic conductive films ACF1, ACF2.

The active matrix substrate SUB1 and the color filter substrate SUB2 have peripheries of respective main surfaces thereof which face each other laminated to each other using a sealing material SL, and liquid crystal LC is filled in a space surrounded by both main surfaces and the sealing material SL. A multi-layered wiring layer ECC which is formed by stacking a plurality of wiring layers each of which is formed by patterning a copper foil is provided to the multi-layered printed circuit board PCB. The respective wiring layers contained in the multi-layered wiring layer ECC are suitably electrically connected via through holes THL extending in the stacking direction.

The input terminals TM of the above-mentioned tape carrier packages TCP are electrically connected to the wiring layer formed on the upper surface of the multi-layered printed circuit board PCB. The connection portions are not at end portions of the upper surface of the multi-layered printed circuit board PCB close to the active matrix substrate SUB1 but are arranged at positions remote from the active matrix substrate SUB1 in the widthwise direction of the multi-layered printed circuit board PCB. Accordingly, the tape carrier packages TCP partially stride over the upper surface of the multi-layered printed circuit board PCB and shades of the semiconductor chips IC mounted on the tape carrier packages TCP are projected to the upper surface of the multi-layered printed circuit board PCB which strides over the tape carrier packages TCP. Accordingly, by bending the tape carrier packages TCP and by storing the semiconductor chips IC mounted on the tape carrier packages TCP together with the multi-layered printed circuit board PCB toward the side or the back surface (the main surface which does not face the color filter substrate SUB in an opposed manner) of the active matrix substrate SUB1, the peripheral size of the liquid crystal panel PNL can be narrowed.

Figure 11:
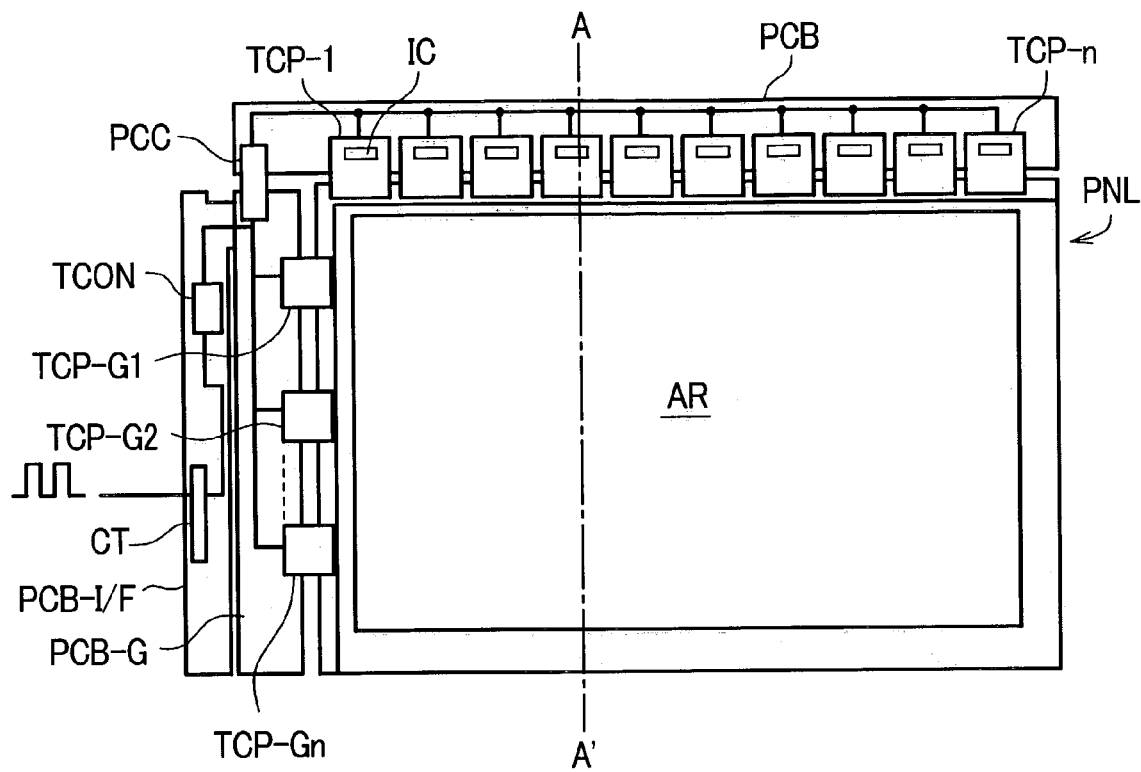
FIG. 11 is a plan view for explaining a constitutional example of a drive system of the liquid crystal display device which constitutes one example of the display device according to the present invention.

FIG. 11 is a plan view for explaining a constitutional example of a drive system of a liquid crystal display device which constitutes one example of the display device according to the present invention. On one of long sides of a liquid crystal panel PNL which is formed by laminating an active matrix substrate and a color filter substrate with liquid crystal therebetween, a multi-layered printed circuit board PCB for data driving is arranged. On a display area AR of the liquid crystal panel PNL, a large number of thin film transistors which constitute active elements are arranged in a matrix array. Further, output terminals provided to the wiring of the multi-layered printed circuit board PCB and leads provided to end peripheries of the active matrix substrate are connected to each other by tape carrier packages TCP (TCP-1 to TCP-n).

On one of short sides of the liquid crystal panel PNL, a multi-layered printed circuit board PCB-G for gate driving is arranged. Wiring terminals of the multi-layered printed circuit board PCB-G and gate line leads provided to the active matrix substrate of the liquid crystal panel PNL are connected to each other by tape carrier packages TCP (TCP-G1 to TCP-Gn). Reference symbol PCB-1/F indicates an interface substrate which supplies display signals inputted to the interface substrate PCB-1/F through a connector CT from an external signal source to the multi-layered printed circuit boards PCB and PCB-G after converting the display signals into a signal form necessary for displaying on the liquid crystal panel PNL. Reference symbol TCON indicates a timing converter which generates various clock signals for display on the liquid crystal panel and the like. Here, reference symbol PCC indicates a printed circuit board which is served for connecting the multi-layered printed circuit boards PCB and PCB-G.

Figure 12:
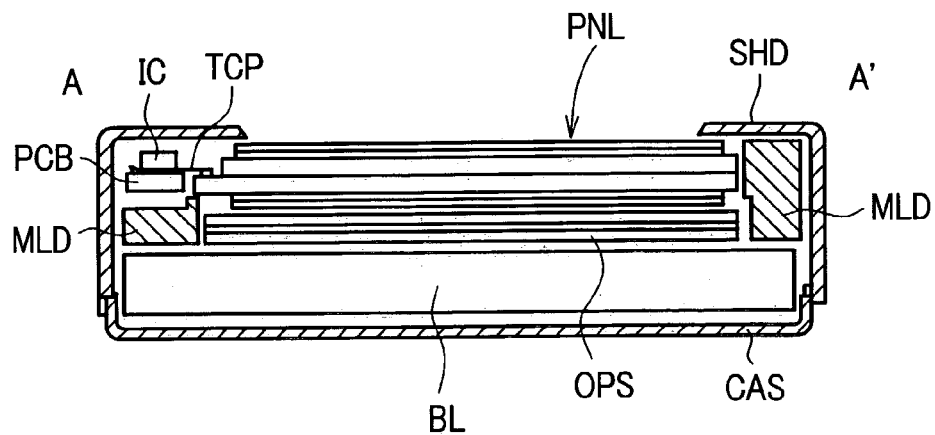
FIG. 12 is a schematic cross-sectional view for explaining one example of the liquid crystal display device corresponding to the cross-sectional view taken along a line A–A' in FIG. 11.

FIG. 12 is a schematic cross-sectional view for explaining one example of the liquid crystal display device corresponding to a cross-sectional view taken along a line A–A' in FIG. 11. FIG. 12 shows a state in which an optical compensation sheet OPS consisting of a diffusion plate and a prism sheet and a backlight BL are overlapped to a back surface of a liquid crystal panel explained in conjunction with FIG. 11 and an upper casing SHD and a lower casing CAS are integrally joined. Reference symbol MLD is a resin mold frame which holds the liquid crystal panel PNL, the optical compensation sheet OPS and the backlight BL so as to ensure a given positional relationship among them. The above-mentioned constitutions of the liquid crystal panel and the liquid crystal display device which have been explained heretofore merely constitute examples and they can have other various other constitutions.

As has been explained heretofore, according to the present invention, it is possible to provide the highly reliable display device capable of preventing the occurrence of defective display which can obviate the warp of the insulating substrate and the breaking of semiconductor chip mounted on the tape carrier packaged or the chip-on-films which are caused by the difference in thermal expansion coefficient between the insulating substrate which constitutes the display panel and the multi-layered printed circuit board when the multi-layered printed circuit board is used for transfer of signals to the display panel, the thermal deformation attributed to the difference in the thermal expansion coefficient or the residual stress, whereby the connection failure between the leads on the insulating substrate and the wiring or the like of the tape carrier packages and the disconnection in the tape carrier packages can be suppressed.

What is claimed is:

1. A display device, comprising:
an insulating substrate which has a large number of electrodes, having an end periphery thereof on which a plurality of leads which supply signals for image display to the respective electrodes are formed;
a multi-layered printed circuit board which is arranged along the end periphery and includes wiring for transmitting the signals for image display along the end periphery; and
a plurality of printed circuit boards for bridging which are arranged in parallel along the end periphery of the insulating substrate, wherein for every one of a plurality of groups of leads formed by dividing the plurality of leads along the end periphery, each printed circuit board bridges the wiring of the multi-layered printed circuit board with one of the plurality of groups of leads, wherein
the multi-layered printed circuit board includes at least a unit which has at least one base sheet which is formed by impregnating an insulating sheet fiber member with resin and conductive layers which are stacked and fixed to the base sheet and are insulated from each other by the base sheet, and imperfect connection parts which attenuate an elongation and a shrinkage of the multi-layered printed circuit board in the longitudinal direction in a plane of the base sheet, the imperfect connection parts are formed at a portion of the sheet fiber member of the base sheet, and
the imperfect connection parts extend between the printed circuit boards for bridging in the direction which connects end peripheries of the printed circuit boards for bridging along the widthwise direction.

2. A display device according to claim 1, wherein a semiconductor chip is mounted on the printed circuit board for bridging.

3. A display device according to claim 1, wherein another insulating substrate is further arranged to face the insulating substrate, these insulating substrates have respective peripheries thereof adhered to each other, and liquid crystal is filled and sealed between the insulating substrate and another insulating substrate.

4. A display device, comprising:
an insulating substrate which has a large number of electrodes, having an end periphery thereof on which a plurality of leads which supply signals for image display to the respective electrodes are formed;
a multi-layered printed circuit board which is arranged along the end periphery and includes wiring for transmitting the signals for image display along the end periphery; and
a plurality of printed circuit boards for bridging which are arranged in parallel along the end periphery of the insulating substrate, wherein for every one of a plurality of groups of leads formed by dividing the plurality of leads along the end periphery, each printed circuit board bridges the wiring of the multi-layered printed circuit board with one of the plurality of groups of leads, wherein
the multi-layered printed circuit board includes at least a unit which has at least one base sheet which is formed by impregnating an insulating sheet fiber member with resin and conductive layers which are stacked and fixed to the base sheet and are insulated from each other by the base sheet, and imperfect connection parts which attenuate an elongation and a shrinkage of the multi-layered printed circuit board in the longitudinal direction in a plane of the base sheet, the imperfect connection parts are formed at a portion of the sheet fiber member of the base sheet,
the imperfect connection parts are constituted of an imperfect connection parts of a first row which are intermittently arranged in the longitudinal direction of the multi-layered printed circuit board and are positioned at the end periphery of a side remote from the insulating substrate, and an imperfect connection parts of a second row which are intermittently arranged in the longitudinal direction of the multi-layered printed circuit board and are positioned at the end periphery of a side close to the insulating substrate, and
the imperfect connection parts of the first row are formed between arrangements of the printed circuit boards for bridging and the imperfect connection parts of the second row are formed at positions where the printed circuit boards for bridging are overlapped to the multi-layered printed circuit board.

5. A display device according to claim 4, wherein between the imperfect connection parts of the first row and the imperfect connection parts of the second row along the longitudinal direction of the multi-layered printed circuit board, the insulating sheet fiber member is continued without being deformed.

6. A display device according to claim 4, wherein the imperfect connection parts of the first row and the imperfect connection parts of the second row are arranged in a staggered manner along the longitudinal direction of the multi-layered printed circuit board.

7. A display device according to claim 4, wherein between the imperfect connection parts of the first row and the end periphery of the multi-layered printed circuit board on a side remote from the insulating substrate, an area where the insulating sheet fiber member is formed continuously without being deformed is provided.

8. A display device, comprising:
- an insulating substrate which has a main surface on which a plurality of electrodes contributing to an image display operation are formed, wherein a plurality of leads which supply signals to the plurality of respective electrodes are arranged in parallel along at least one side of the main surface of the insulating substrate;
- a multi-layered printed circuit board which has wiring for transmitting the signals along at least one side of the main surface of the insulating substrate; and
- a plurality of printed circuit boards which respectively bridge a distance between the multi-layered printed circuit board and at least one side of the main surface of the insulating substrate, and supply the signal to at least one of groups of the plurality of leads which are formed in a divided manner at least along one side of the main surface from the multi-layered printed circuit board, wherein the multi-layered printed circuit board has a laminated structure which includes at least a base sheet formed of an insulating sheet fiber member impregnated with resin and a conductive layer formed on the base sheet and insulated from the base sheet, the extension direction of the base sheet is arranged along at least one side of the main surface of the insulating substrate, a plurality of discontinued areas in the extending direction of the base sheet are formed in the insulating sheet fiber member, and the discontinued areas of the sheet fiber member which are formed in the base sheet of the multi-layered printed circuit board extend in the direction which traverses the extending direction of the base sheet so as to divide the sheet fiber member into sections.

9. A display device according to claim 8, wherein films made of the resin which extend along the extension direction of the base sheet are formed on the discontinued areas of the sheet fiber member formed in the base sheet of the multi-layered printed circuit board.

10. A display device according to claim 8, wherein the sheet fiber member formed in the base sheet of the multi-layered printed circuit board are not completely separated along the extending direction of the base sheet in the discontinued areas.

* * * * *